United States Patent [19]
Mott et al.

[11] Patent Number: 5,736,279
[45] Date of Patent: Apr. 7, 1998

[54] ACCURATE DRILLING OF PROBE HOLES IN THE INSULATING PLATE OF AN ELECTRICAL TEST HEAD

[75] Inventors: Gary Damon Mott; Ronald Romonosky, both of Austin; Dale Wayne Wilhite, Round Rock, all of Tex.

[73] Assignee: International Business Machines Corporation, Armonk, N.Y.

[21] Appl. No.: 746,063

[22] Filed: Nov. 6, 1996

[51] Int. Cl.⁶ .................... G06F 9/00; G01R 15/12
[52] U.S. Cl. .................. 430/22; 430/320; 430/325; 430/329; 324/758; 324/761
[58] Field of Search .................. 324/537, 754, 324/758, 761, 765; 430/22, 325, 329, 320

[56] References Cited

U.S. PATENT DOCUMENTS

| | | |
|---|---|---|
| 3,266,343 | 8/1966 | Jellig. |
| 3,532,893 | 10/1970 | Marantette et al.. |
| 3,574,933 | 4/1971 | Cassingham. |
| 4,183,609 | 1/1980 | Luna ........................ 324/761 |
| 4,443,756 | 4/1984 | Lightbody et al. ........ 324/761 |
| 4,897,598 | 1/1990 | Doemens .................. 324/761 |
| 5,511,304 | 4/1996 | Aksu ........................ 324/758 |

*Primary Examiner*—Christopher G. Young
*Attorney, Agent, or Firm*—Casimer K. Salys

[57] ABSTRACT

A method for manufacturing insulating plates with accurately located holes in patterns suitable for bed of nails type test heads. An optically aligned drilling machine is used to form holes in the insulating plate conforming to the test pattern by using a reference pattern photolithographically formed onto the insulating plate. The photolithographic formation provides a pattern of greater accuracy and maintains that accentuated degree of accuracy through camera alignment and fixed offset between commonly mounted camera and drill. The tighter registration of copper features in advanced printed circuit boards subject to testing with the bed of nails test heads require insulating plates hole patterns with the accentuated accuracy provided by the method.

8 Claims, 3 Drawing Sheets

ACCURATE DRILLING OF PROBE HOLES IN THE INSULATING PLATE OF AN ELECTRICAL TEST HEAD

TECHNICAL FIELD

The present invention relates generally to the drilling of hole patterns in plates. More particularly, the invention is directed to the drilling of accurately located holes using optically defined patterns formed onto the plates.

BACKGROUND OF THE INVENTION

Electrical test heads used to perform bed of nail testing of printed circuit board wiring features are conventionally manufactured using insulating (dielectric) plates drilled with hole patterns related to the printed circuit board undergoing test. Electrically conductive probes are inserted through the holes in the plates as a part of fabricating a bed of nails test grid suitable for a particular copper feature pattern on a printed circuit board. Test heads used to evaluate advanced circuit boards commonly have five to twenty-five thousand probes per board to be tested. With the decreasing dimensions of advanced printed circuit boards, the tolerances in the test heads have decreased and the associated costs of head manufacturing have increased, particularly for those printed circuit manufacturers which incur the additional head replacement cost associated with 100% testing of their printed circuit board products.

The accuracy of the hole locations in the insulating plate are crucial in correctly positioning the probes to reliably test the manufactured printed circuit boards. This is particularly relevant when printed circuit boards have fine pitch copper features, in that probes are routinely canted to avoid shorting one to another while contacting the tightly spaced copper features on the printed circuit board. An example of such features are the surface mount contacts used for integrated circuit devices, whether packaged or in flip-chip configuration. Inaccurate probe alignment can cause the scrappage of good printed circuit boards at a stage in the printed circuit board manufacturing where the board has significant market value.

Present insulating plate drilled hole location accuracy is in the range of 0.003 inches at the three standard deviation level. However, advanced printed circuit board requirements are moving toward a copper feature, typically contact, pitch of approximately 0.010 inches, divided evenly between 0.005 contacts and 0.005 contact separation space. In the context of such advanced products, the 0.003 inch three standard deviation insulator head hole accuracy is no longer acceptable. A three standard deviation value of 0.001 inches is believed to be a desired, if not necessary, objective.

Thus there exists a need for a method which produces accurately drilling hole patterns in insulating plates suitable for bed of nail type printed circuit board test heads with probe hole location accuracies a factor of three better than presently attainable through conventionally numerically controlled drilling.

SUMMARY OF THE INVENTION

The accuracy problem associated with the hole patterns in insulating plates is solved according to the present invention through the steps of applying a layer of photoimageable material to the planar surface of the insulating plate, exposing the photoimageable material in a pattern related to the hole pattern, developing the photoimageable material to leave a reference pattern suitable for drill alignment, and drilling the insulating plate using the reference pattern for alignment. Further refinements include the use of an optically aligned drill machine employing the reference patterns on the insulating plate and the stripping of the reference pattern from the insulating plate after drilling of the hole pattern.

In a particularized form of the invention, an insulating plate is photolithographically processed to generate an optical accuracy reference pattern related to the pattern to be drilled in the insulating plate. Drilling of the insulating plate is accomplished using an optically aligning drill, where the alignment camera uses the photolithographic accurate hole location pattern formed on the insulating plate as a reference for drilling. Since the camera-to-drill offset is consistent from hole to hole, the overall accuracy can be improved materially over a conventional XYZ numerically controlled drill positioning system.

These and other features of the invention will be more clearly understood and appreciated upon considering the detailed embodiment described hereinafter.

DETAILED DESCRIPTION OF THE PREFERRED EMBODIMENT

Figure 1:
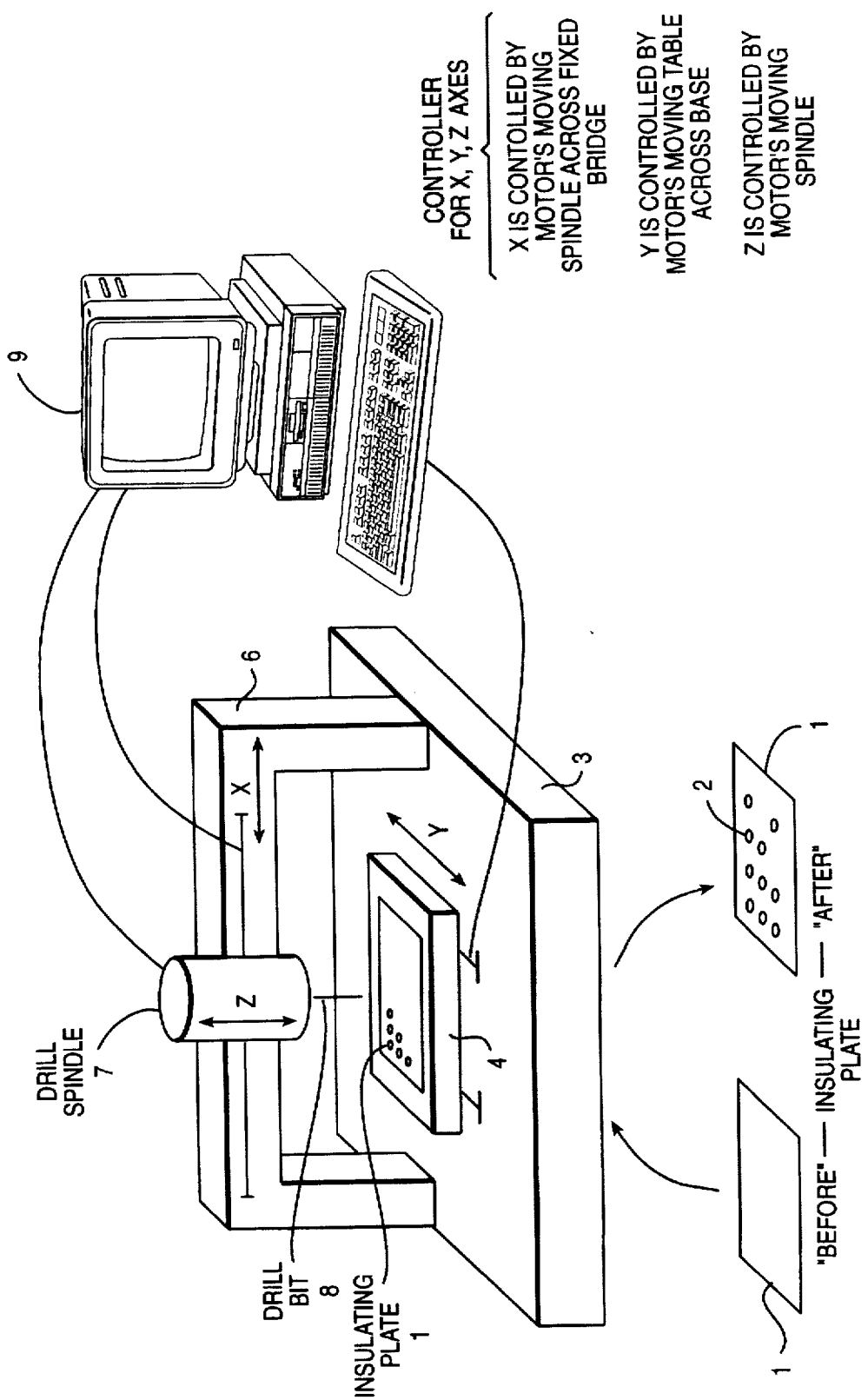
FIG. 1 schematically depicts the insulating plate drilling process as presently practiced.

The prior art as schematically depicted in FIG. 1 generally involves the use of a numerically controlled drilling machine to create probe holes, nominally 0.019 inches in diameter, in an insulating plate for use with a bed of nails type electrical test head. In keeping with accuracies required of conventional printed circuit board designs, the locations of the holes in the insulating plate have a nominal three standard deviation value of 0.003 inches.

FIG. 1 depicts raw insulating plate 1 before hole drilling, and completed insulating plate 1 with holes 2 after hole drilling to the tolerances of conventional test heads. The drilling is accomplished using a machine having bed 3 upon which is mounted moving table 4, the movements of Table 4 defining the hole locations in Y direction. Insulating plate 1 is mounted on table 4. Bridge structure 6 is connected to bed 3 so as to provide X direction movement for drill spindle 7. Drill bit 8 creates holes in insulating plate 1 by Z direction movement of drill spindle 7. Movements in the X, Y and Z axes are regulated by numerical controller 9, preferably a computer based digital controller.

The critical X and Y positions for each hole are not derived directly with reference to insulating plate 1, but rather indirectly through X and Y positions defined by moving table 4 and bridge 6. Each new hole requiring X and Y repositioning generates a new positioning error, within the system tolerances but relatively random from hole location to hole location. As noted hereinbefore, the relative error buildup exceeds the tight registration requirements of features on advanced printed circuit boards, and especially those having surface mounted integrated circuit devices.

Figure 2:
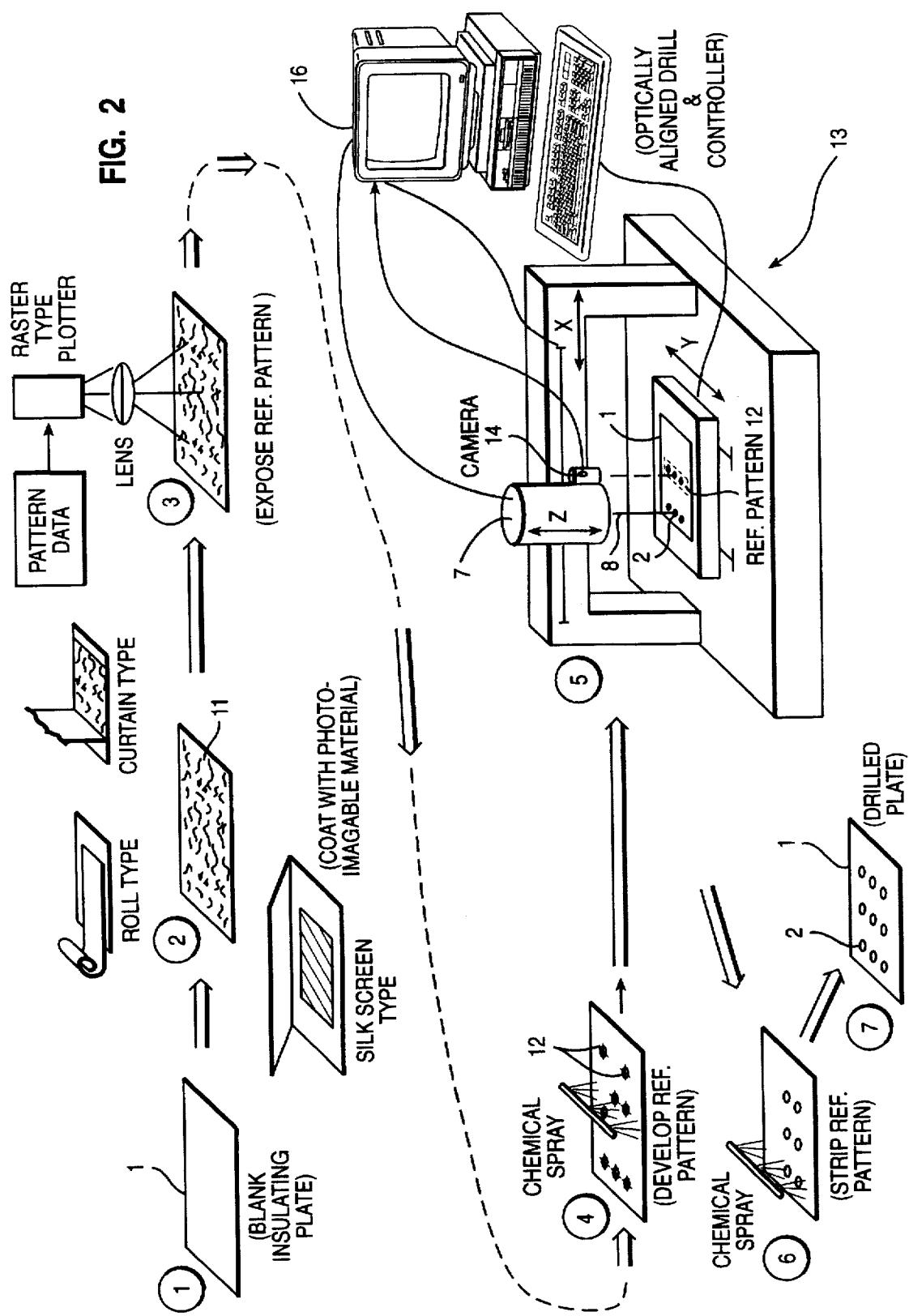
FIG. 2 schematically depicts an embodiment of the process conforming to the present invention, including the formation and use of an optically defined reference pattern.

The accentuated accuracy required of test heads associated with advanced printed circuit board copper features, mainly those having tighter registration as a consequence of smaller pitch as well as mixes of on grid and off grid feature locations, is attained through the practice schematically depicted in FIG. 2. Fabrication preferably follows the process steps 1–7 shown in the figure. The operation accomplished at each step is generally described by text enclosed within parentheses. Improvement in hole accuracy by a factor 4 to 6 is attained through the combination of having all the hole locations defined during a single operation, having the hole locations defined by highly accurate photolithographic processing, and having a single fixed, mechanically offset between the hole making device, the drill, and the optical positioning device, the camera. These elements are evident in the third and fifth steps of the manufacturing process depicted in FIG. 2.

The practice of the invention provides on grid and off grid hole pattern capability with a nominal three standard deviation error of 0.001 inches. As such, the holes are consistent with the tighter registration tolerances of advanced insulating plates and associated printed circuit board copper features.

The process in FIG. 2 begins with step 1. At that point, insulating plate 1 composed of polycarbonate and having a nominal thickness of 0.062 inches is coated as shown in FIG. 2 with a photoimageable material. The photoimageable material may be applied in a number of manners, including thermo-compression bonding of a thin film from a roll, curtain type spreading of a liquid based photoimageable material, or silk screen deposition of a liquid photoimageable material. A particularized example involves the use of photopolymer material manufactured by and commercially available from DuPont, which is laminated onto the insulating plate 1 to form as shown at step 2 a photoimageable layer 11 on plate 1.

FIG. 2 depicts at step 3 the exposure of the photoimageable material to actinic radiation adequate to define a reference pattern for the holes to be drilled. Exposure is preferably accomplished using accurate optical apparatus, such as one involving a radiation source and raster scanner, or one employing a mask and lens, where the mask is an image of the desired hole pattern. A particular example involves the use of Orbotech equipment to expose the pattern.

At step 4, the exposed photoimageable material is developed by chemical spray or the like to retain, in positive or negative form, hole pattern 12. At step 5, insulating plate 1 with pattern 12 is mounted in a drilling machine, generally at 13, to fabricate the actual holes in the insulating plate.

Though drilling machine 13 is similar to that of the prior art shown in FIG. 1, it differs in a critical aspect. The final, fine verses coarse, alignment of the drill is derived directly with reference to pattern 12 formed on the insulating plate itself. The hole positioning system now includes not only drill spindle 7 and drill bit 8, but alignment camera 14. Controller 16 defines both the coarse and fine X and Y direction adjustments in the positioning of the drill. Fine positioning is accomplished through optical alignment using camera 14 and individual hole targets in reference pattern 12, so that holes 2 formed in insulating plate 1 are consistently referenced to pattern 12.

As embodied at step 5, holes 2 are offset by a fixed and consistent distance from the actual reference pattern 12. However, it may also be possible to have the reference pattern and hole location coincide, if the optical system of camera 14 is so configured.

The stripping of the reference pattern as shown at step 6 preferably follows. The removal of the reference pattern may not be necessary if pattern 12 and holes 2 coincide, or if the reference pattern is located on a discarded portion of an oversized raw insulating plate.

The process is complete at step 7, where plate 1 has a multiplicity of accurately drilled holes consistent with the probe pattern required for the bed of nails test head.

Figure 3:
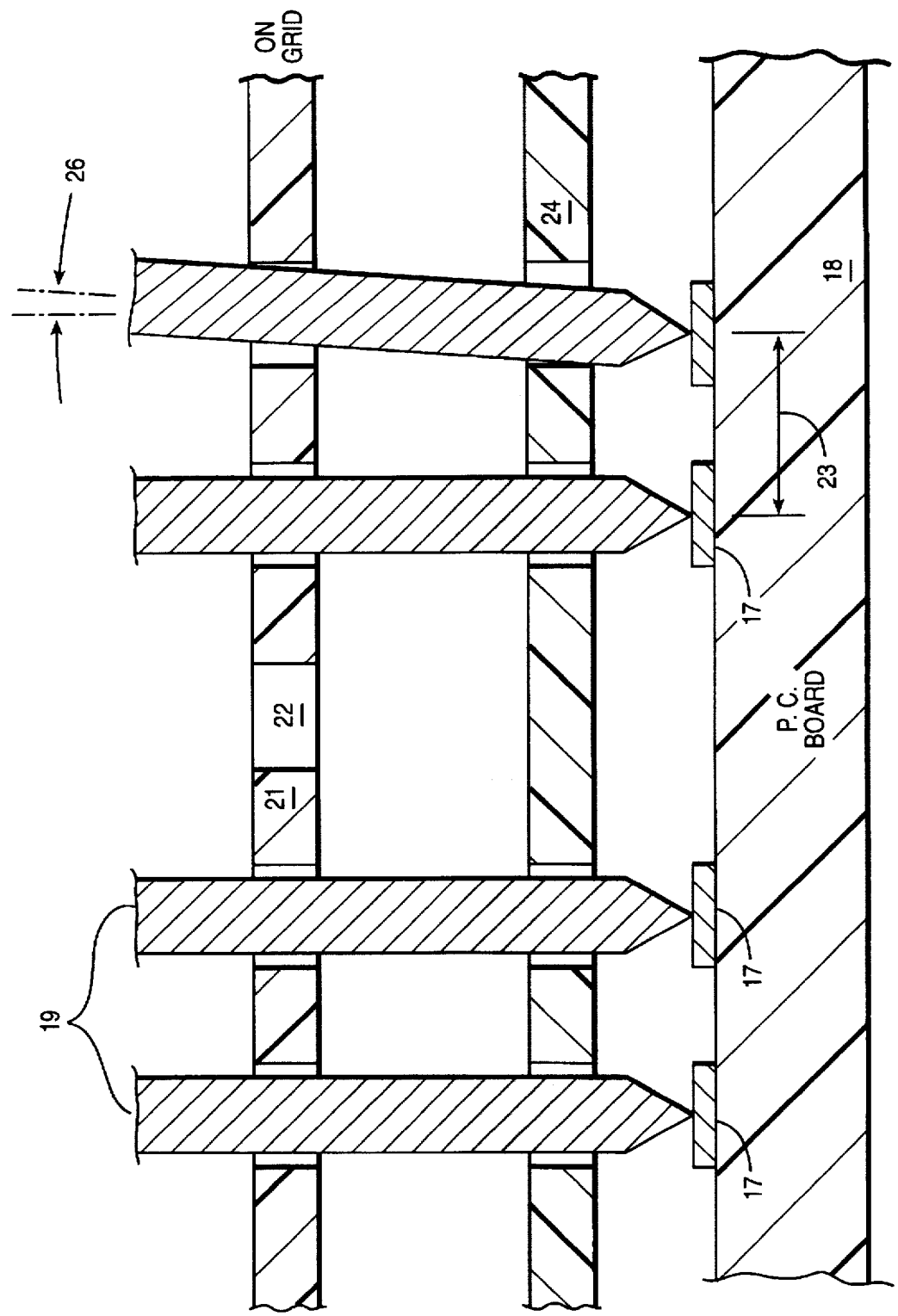
FIG. 3 illustrates by schematic cross-section the relation of the test probes to the holes in the insulating plate, and underlying printed circuit board copper features.

FIG. 3 schematically illustrates by cross-section example uses for drilled insulating plates in test heads. Features 17 on printed circuit board 18 are to be tested for continuity or open circuit, as appropriate, by bed of nails tester probes 19. Conventional practice involves the use of multiple insulating plates, including at least one on-grid insulating plate 21 having a multiplicity of holes 22 drilled in conformance with a grid pattern.

Most copper features 17 on printed circuit board 18 are on grid. However, it is also common to have off-grid features. For example, the reduced size of spacing 23 indicates an off-grid copper feature and as such is also likely to require tighter tolerances than those allowed for the on-grid pattern itself. Test insulating plate 24 must be accurately drilled to ensure that the points of probes 19 contact copper features located both at on-grid and off-grid positions. The accuracy problem is magnified with the tighter registration in advanced printed circuit board features and the need for angular refinements of probes 19 such as at 26.

The present invention allows the manufacture of insulating plates 24, as well as on-grid insulating plate 21, with the accuracy required in testing copper features on advanced printed circuit boards.

It will be understood by those skilled in the art that the embodiments set forth hereinbefore are merely exemplary of the numerous arrangements by which the invention may be practiced, and as such may be replaced by equivalents without departing from the invention which will now be defined by appended claims.

We claim:

1. In the fabrication of a test head having a selectively patterned grid of probes located by a hole pattern in an insulating plate, a method of accurately forming the hole pattern, comprising the steps of:

applying a layer of photoimageable material to a planar surface of the insulating plate;

exposing the photoimageable material in a pattern related to the hole pattern;

developing the photoimageable material to leave a reference pattern suitable for drill alignment; and drilling the insulating plate using the reference pattern for alignment.

2. The method recited in claim 1, wherein the drilling is accomplished with an optically aligning drill machine.

3. The method recited in claim 1, comprising the further step of stripping the reference pattern after the drilling of the insulating plate.

4. The method recited in claim 2, comprising the further step of stripping the reference pattern after the drilling of the insulating plate.

5. In the fabrication of a test head having a selectively patterned grid of probes located by a hole pattern in an insulating plate, a method of accurately forming the hole pattern, comprising the steps of:

applying a layer of photoimageable material to one planar surface of the insulating plate;

exposing the photoimageable material in a pattern which defines the hole pattern;

developing the photoimageable material to leave a reference pattern defining the holes to be drilled; and drilling the insulating plate in the pattern defined by the developed photoimageable material.

6. The method recited in claim 5, wherein the drilling is accomplished with an optically aligning drill machine.

7. The method recited in claim 5, comprising the further step of stripping residual developed photoimageable material after the drilling of the insulating plate.

8. The method recited in claim 6, comprising the further step of stripping residual developed photoimageable material after the drilling of the insulating plate.

* * * * *